United States Patent
Jang et al.

[11] Patent Number: 6,037,611
[45] Date of Patent: Mar. 14, 2000

[54] THIN FILM TRANSISTOR AND ITS FABRICATION

[75] Inventors: Jin Jang; Kyung-Ha Lee, both of Seoul, Rep. of Korea

[73] Assignee: LG Electronics Inc., Seoul, Rep. of Korea

[21] Appl. No.: 08/980,311

[22] Filed: Nov. 28, 1997

[30] Foreign Application Priority Data

May 1, 1997 [KR] Rep. of Korea ............ 97-16913

[51] Int. Cl.⁷ ............ H01L 29/04; H01L 29/76
[52] U.S. Cl. ............ 257/66; 257/56; 257/59; 257/53; 257/412; 257/413
[58] Field of Search ............ 257/66, 59, 56, 257/53, 412, 413

[56] References Cited

U.S. PATENT DOCUMENTS

| | | | |
|---|---|---|---|
| 4,999,690 | 3/1991 | Rodder | 257/66 |
| 5,200,630 | 4/1993 | Nakamura et al. | 257/66 |
| 5,231,296 | 7/1993 | Rodder | 257/66 |
| 5,693,959 | 12/1997 | Inoue et al. | 257/66 |
| 5,744,818 | 4/1998 | Yamazaki et al. | 257/66 |
| 5,811,836 | 9/1998 | Ha | 257/56 |
| 5,818,070 | 10/1998 | Yamazaki et al. | 257/72 |

*Primary Examiner*—Wael M. Fahmy
*Assistant Examiner*—Hung Van Duong
*Attorney, Agent, or Firm*—Morgan, Lewis & Bockius LLP

[57] ABSTRACT

A method of fabricating a thin film transistor includes the steps of forming an active layer on an insulating substrate; forming an insulating layer and a first metal layer on the active layer; forming a photoresist pattern for forming a gate electrode on the metal layer; etching the metal layer and the insulating layer by using the photoresist pattern as a mask, and respectively forming a gate electrode and a gate insulating layer to expose a part of the active layer; forming an amorphous silicon layer on the resultant whole surface of the substrate; forming a second metal layer on the amorphous silicon layer; patterning the second metal layer and the amorphous silicon layer by a photolithographic process to form an offset layer and a source/drain electrode; and carrying out a lift-off process to remove the photoresist pattern, and exposing the surface on the gate electrode.

22 Claims, 8 Drawing Sheets

THIN FILM TRANSISTOR AND ITS FABRICATION

This application claims the benefit of Korean patent application No. 97-16913, filed May 1, 1997, which is hereby incorporated by reference.

BACKGROUND OF THE INVENTION

1. Field of the Invention

The present invention relates to a thin film transistor, and more particularly, to a thin film transistor and its fabrication process for reducing leakage current and the number of masks required.

2. Discussion of the Related Art

Many studies have been made of the application of a polysilicon thin film transistor to the active device and peripheral circuits of an active matrix liquid crystal display. A laser annealing is used in the production of thin film transistors using polysilicon. By using a laser annealing, low temperature processes are available for fabrication, and high field effect mobility can be realized.

When polysilicon thin film transistors are used in a liquid crystal display, there are no problems with switching the driving circuit at high frequency due to the characteristics of polysilicon. However, leakage current may increase due to high drain current in the OFF state in the pixel array. Studies are currently conducted on thin film transistors having lightly doped drain (LDD) structures, or offset structures, to decrease the drain electric field, thereby reducing the leakage current. Producing a thin film transistor with an LDD structure or offset gate structure requires additional masking processes compared to producing a conventional thin film transistor.

FIGS. 1A–1E are flow diagrams illustrating a process for fabricating thin film transistors having an offset structure according to conventional techniques.

Referring to FIG. 1A, an amorphous silicon layer is formed on an insulating layer 10 and crystallized by laser annealing. The crystallized silicon layer is patterned by photolithography (using a first mask) to form an active layer 11.

Referring to FIG. 1B, an insulating layer and a metal layer are sequentially formed on the entire surface of the substrate above the insulating layer 10, and patterned by photolithography (using a second mask) to form gate electrodes 13 and a gate insulating layer 12. Reference numeral 11C indicates the channel region of the active layer overlapping the gate electrode 13.

Referring to FIG. 1C, the entire surface is coated with a photosensitive material, and then a photoresist pattern PR is formed (using a third mask), which covers the gate electrode, but exposes a part of the active layer 11. The photoresist pattern defines an offset region 11f.

The entire surface is then doped with an impurity to form ohmic regions in the exposed portions of active layer 11. The ohmic regions are a source region 11S and a drain region 11D. Parts of the active layer are blocked from being doped with impurity by the photoresist pattern PR. Thus, the blocked parts of the active layer, except for the channel region 11C, are offset regions 11f.

Referring to FIG. 1D, insulating material is deposited on the entire surface to form an insulating interlayer 14. The insulating interlayer 14 is patterned by photolithography (using a fourth mask) to form contact holes T exposing the source and drain regions 11S and 11D of the active layer 11.

Referring to FIG. 1E, a metal layer is formed on the entire surface above the insulating layer 10. The metal layer is patterned by a photolithography (using a fifth mask) to form source and drain electrodes 15S and 15D, which are connected to the source and drain regions 11S and 11D which were exposed by the contact hole.

In the fabrication process described above, it is necessary to perform five photolithography processes using five masks. In the fabrication of thin film transistors, reducing the number of masking process is as important as reducing the leakage current at the OFF state. This is because the photolithography is a sequential process, which requires complicated and precise processing, such as masking process, photoresist coating, and exposure and development. Therefore reducing the number of masking process desirably affects the productivity and reliability of fabricated products.

SUMMARY OF THE INVENTION

Accordingly, the present invention is directed to a thin film transistor and its fabrication that substantially obviates one or more of the problems due to the limitations and disadvantages of the related art.

An object of the present invention is to provide a thin film transistor with reduced leakage current at the OFF state.

Another object of the present invention is to provide a thin film transistor which requires a small number of masking steps to fabricate.

Additional features and advantages of the present invention will be set forth in the description which follows, and will be apparent from the description, or may be learned by practice of the invention. The objectives and other advantages of the invention will be realized and attained by the structure and process particularly pointed out in the written description as well as in the appended claims.

To achieve these an other advantages, and in accordance with the purpose of the present invention, as embodied and broadly described, there is provided a thin film transistor including an active layer; a gate insulating layer above the active layer, wherein the active layer includes a portion covered by the gate insulating layer, a first portion of the active layer not covered by the gate insulating layer and a second portion of the active layer not covered by the gate insulating layer; a gate electrode above the gate insulating layer; an offset layer above the first portion of the active layer and above the second portion of the active layer; a source electrode above the first portion of the offset layer; and a drain electrode above the second portion of the active layer.

In another aspect of the present invention, there is provided a method of fabricating a thin film transistor including the steps of forming an active layer above an insulating layer; forming a gate insulating layer above the active layer so as to cover a part of the active layer, wherein the active layer has a first exposed portion and a second exposed portion; forming a gate electrode above the gate insulating layer; forming an offset layer above the first exposed portion of the active layer and above the second exposed portion of the active layer; forming a source electrode above the offset layer and above the first exposed portion of the active layer; and forming a drain electrode above the offset layer and above the second exposed portion of the active layer.

In a further aspect of the present invention, there is provided a method of fabricating a thin film transistor, including the steps of forming an active layer on an insulating substrate; forming an insulating layer and a first metal layer on the active layer; forming a photoresist pattern for forming a gate electrode on the first metal layer; patterning the first metal layer and the insulating layer by using the photoresist pattern as a mask, thereby forming a gate electrode and a gate insulating layer and exposing a part of the active layer; forming an amorphous silicon layer so as to cover the insulating substrate and the active layer; forming a second metal layer on the amorphous silicon layer; patterning the second metal layer and the amorphous silicon layer by a photolithographic process to form an offset layer, a source electrode and drain electrode; and removing the photoresist pattern to expose the surface on the gate electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention that together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

A brief description of the invention will first be made.

According to the present invention, there is provided a thin film transistor including: an insulating layer; an active layer formed on the insulating substrate; a gate insulating layer exposing a part of the active layer; a gate electrode formed on the gate insulating layer; an offset layer formed on the exposed portion of the active layer; and a source/drain electrode formed on the offset layer.

According to the present invention, there is also provided a method of fabricating a thin film transistor including the steps of: forming an active layer on an insulating layer; forming a gate insulating layer and a gate electrode on the active layer, the gate insulating layer and the gate electrode exposing a part of the active layer; forming an offset layer on the exposed portion of the active layer; and forming a source/drain electrode on the offset layer.

According to another preferred embodiment of the present invention, a method of fabricating a thin film transistor includes the steps of: forming an active layer on an insulating substrate; forming an insulating layer and a first metal layer on the active layer; forming a photoresist pattern for forming a gate electrode on the first metal layer; patterning the first metal layer and the insulating layer by using the photoresist pattern as a mask, and respectively forming a gate electrode and a gate insulating layer to expose a part of the active layer; forming an amorphous silicon layer on the resultant whole surface of the substrate; forming a second metal layer on the amorphous silicon layer; patterning the second metal layer and the amorphous silicon layer by a photolithographic process to form an offset layer and a source/drain electrode; and removing the photoresist pattern to expose the surface on the gate electrode.

Figure 1A:
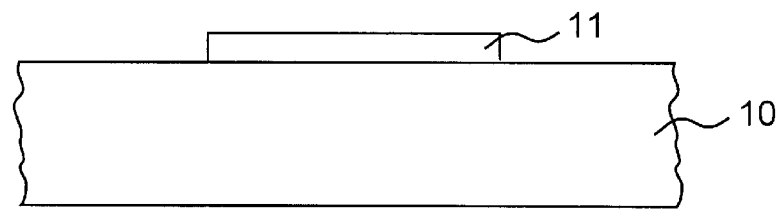
FIGS. 1A to 1E is a diagram of the fabrication process of a thin film transistor in accordance with the prior art.
Figure 1B:
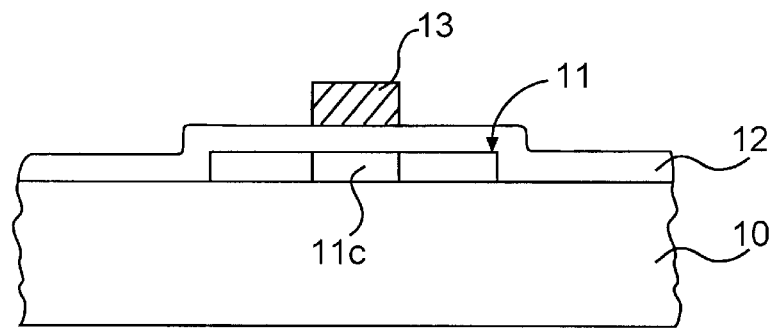
Figure 1C:
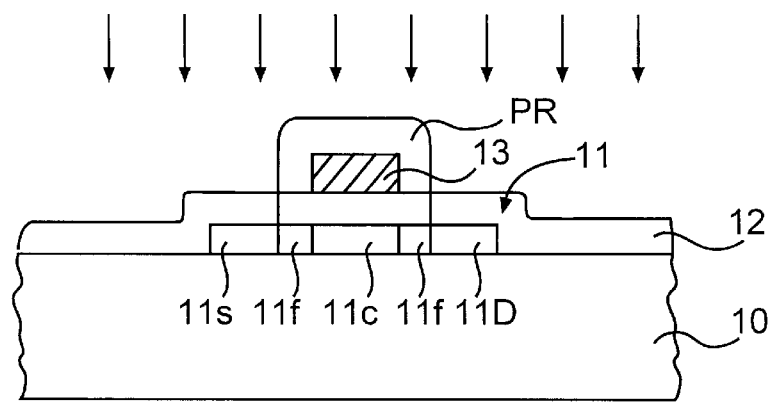
Figure 1D:
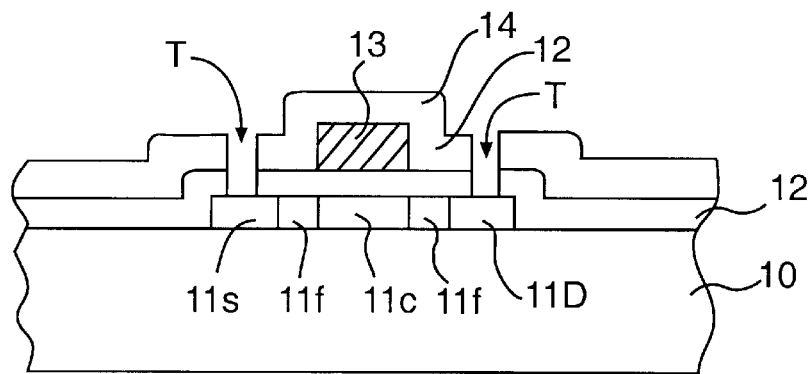
Figure 1E:
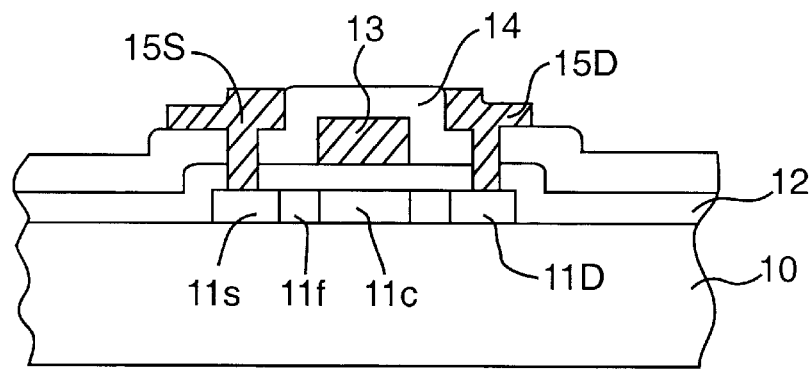
Figure 2:
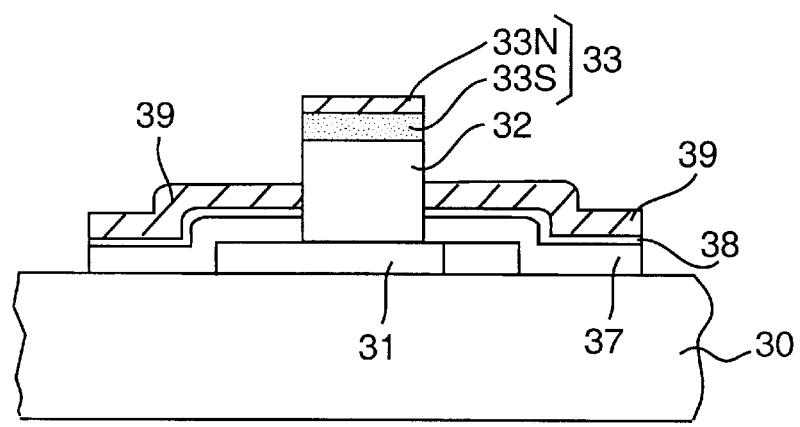
FIG. 2 is a cross-section of a thin film transistor in accordance with a preferred embodiment of the present invention.

FIG. 2 is a cross-sectional view of a thin film transistor in accordance with a preferred embodiment of the present invention in which an offset layer is formed above the active layer.

As shown in FIG. 2, an active layer 31 made of polysilicon is formed on a transparent insulating substrate 30, such as glass. A gate electrode 33 and a gate insulating layer 32 are formed at a designated position on the active layer 31 exposing portions of the active layer 31. The gate electrode 33 is preferably a double-layered structure having an upper metal layer, such as a nickel layer 33N, and a lower metal silicide layer, such as a nickel-silicide layer 33S. On the exposed portions of the active layer 31, an offset layer 37, an ohmic contact layer 38, and a source/drain electrode 39 are sequentially formed. The offset layer 37 covers the exposed portions of the active layer 31, and the source/drain electrode 39 and the ohmic contact layer 38 are formed on the offset layer 37. Accordingly, unlike a conventional thin film transistor having the offset layer formed laterally in the active layer, the offset layer 37 of the present invention is above the active layer 31. Such a structure makes it possible to reduce the size of a thin film transistor by decreasing the size of the offset layer.

FIGS. 3A–3F are diagrams of the fabrication process for the thin film transistor shown in FIG. 2. In the drawings, the thin film transistor taken as an example is about 60 $\mu$m in width and 46 $\mu$m long.

Figure 3A:
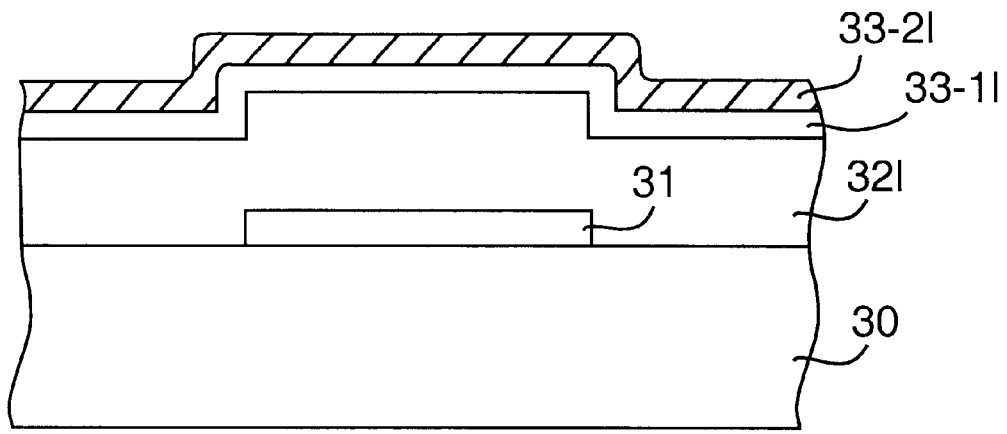
FIGS. 3A–3F illustrates the fabrication process of the thin film transistor of the present invention shown in FIG. 2.

Referring to FIG. 3A, an active layer 31 having a thickness of, for example, between several nanometers and 200 nm (preferably 60 nm) is formed on an insulating substrate 30. The active layer 31 is formed by depositing an amorphous silicon layer on the insulating substrate 30 by PECVD (Plasma Enhanced Chemical Vapor Deposition), annealing at about 450° C. for 1 hour to reduce the hydrogen content in the amorphous silicon layer, crystallizing the amorphous silicon layer by a laser, and patterning it into a designated shape by a photolithography (using a first mask). For the purpose of crystallizing the amorphous silicon layer, an XeCl laser (having wavelength of 308 nm and a pulse duration of 45 ns) can be used in the annealing process.

A silicon nitride layer 32$\ell$ having a thickness of, for example, between several nanometers and 500 nm (preferably 350 nm), an amorphous silicon layer 33-1$\ell$ having a thickness of, for example, between several nanometers and 200 nm (preferably 20 nm), and a nickel layer 33-2$\ell$ having a thickness of, for example, between several nanometers and 200 nm (preferably 20 nm) are formed on the active layer 31. The silicon nitride layer 32$\ell$ and the amorphous silicon layer 33-1$\ell$ are formed by the PECVD method (described above), and the nickel layer 33-2$\ell$ is formed by a sputtering method. Instead of a silicon nitride layer, a silicon oxide layer or the like can be used. Instead of the nickel layer described above, a high melting point metal layer such as chromium, platinum, or the like, which can be silicidated, can be used.

Figure 3B:
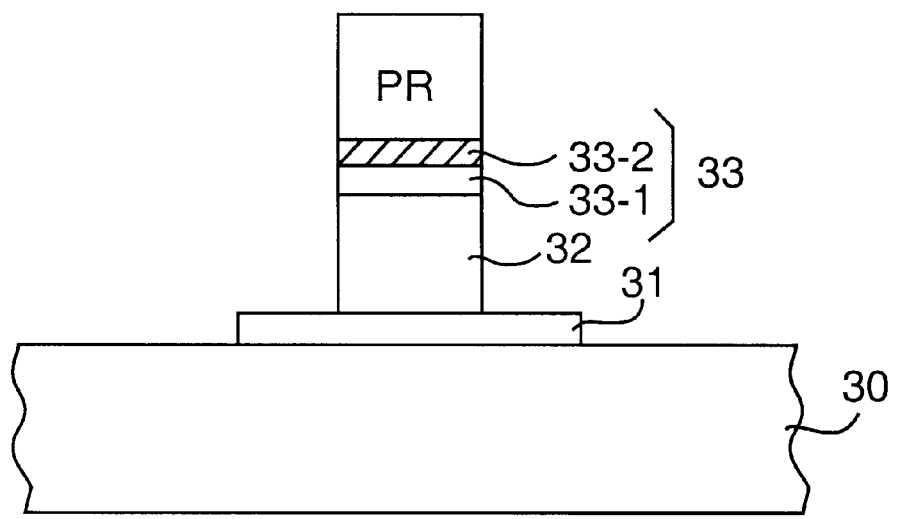

Referring to FIG. 3B, a photosensitive material layer is formed on the exposed nickel layer 33-2ℓ by spin coating, and the photosensitive material layer is patterned by exposure (using a second mask) and developed to form a photoresist pattern PR, which is used to form a gate electrode.

Next, the nickel layer 33-2ℓ, the amorphous silicon layer 33-1ℓ, and the silicon nitride layer 32ℓ are patterned by using the photoresist pattern PR as a mask to form a gate electrode 33 and a gate insulating layer 32. The nickel layer 33-2ℓ is etched preferably by wet etching using a mixed solution of phosphoric acid, nitric acid, acetic acid, and the like as the etchant. The amorphous silicon layer 33-1ℓ is etched using a reactive gas (i.e., $CF_4+O_2$, $C_2ClF_5$). The insulating layer 32ℓ is etched using a reactive gas (i.e., $CF_4+O_2$, $C_2F_6+O_2$).

Figure 3C:
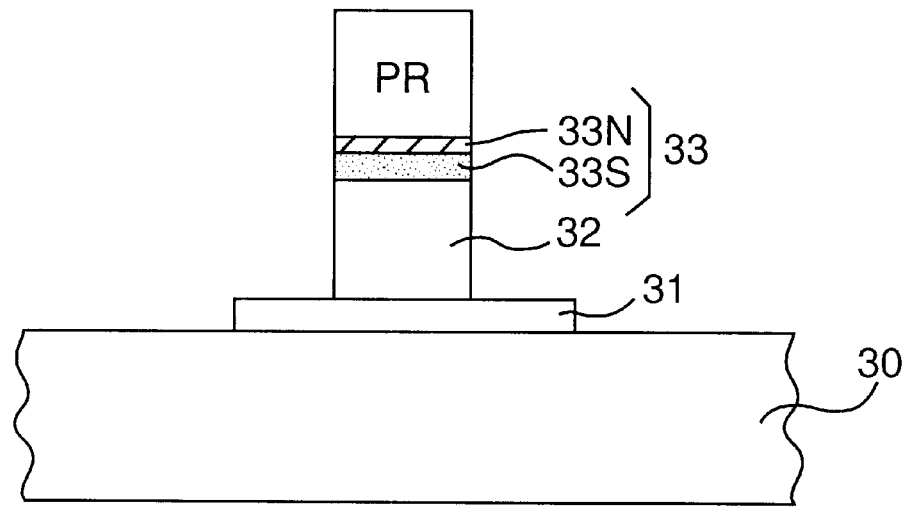

Referring to FIG. 3C, a nickel silicide layer 33S is formed from the amorphous silicon layer 33-1 and the nickel layer 33-2 in contact with the amorphous silicon layer of the gate electrode 33 by annealing for about one hour preferably in an Ar atmosphere at a substrate temperature of about 250° C. The nickel silicide layer 33S formed on the gate insulating layer 32 prevents the nickel layer from being separated from the gate insulating layer 32 during subsequent processing, which is performed at room temperature. This is because the nickel silicide layer adheres to the insulating layer more strongly than the nickel layer. Reference numeral 33N indicates a non-silicidated nickel layer.

Figure 3D:
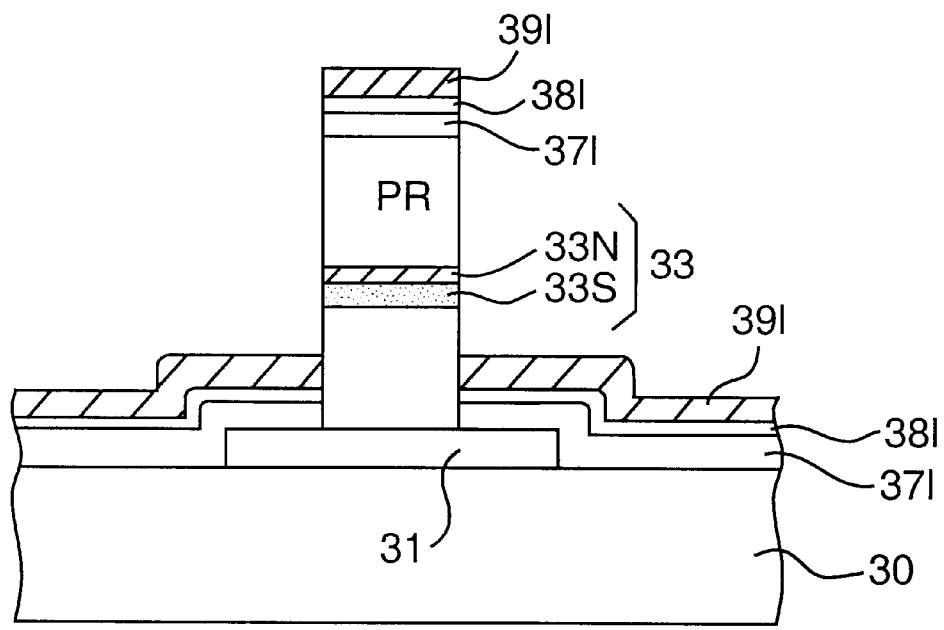

Referring to FIG. 3D, an amorphous silicon layer 37ℓ having a thickness of, for example, between several nanometers and 200 nm (preferably 20 nm) is formed. Part of the amorphous silicon layer 37ℓ is heavily doped with an ion impurity to form a doped amorphous silicon layer 38ℓ. A nickel layer 39ℓ having a thickness of, for example, between several nanometers and 200 nm (preferably 30 nm) is preferably formed. Instead of the nickel layer, a conductive layer made of another conductive material such as chromium aluminum, tantalum or the like can also be used. The amorphous silicon layer and the nickel layer, as described above, are formed respectively by PECVD and sputtering. Also, as shown in FIG. 3D, the amorphous silicon layer 37ℓ, the doped amorphous silicon layer 38ℓ, and the nickel layer 39ℓ are sequentially formed on the photoresist pattern PR.

Figure 3E:
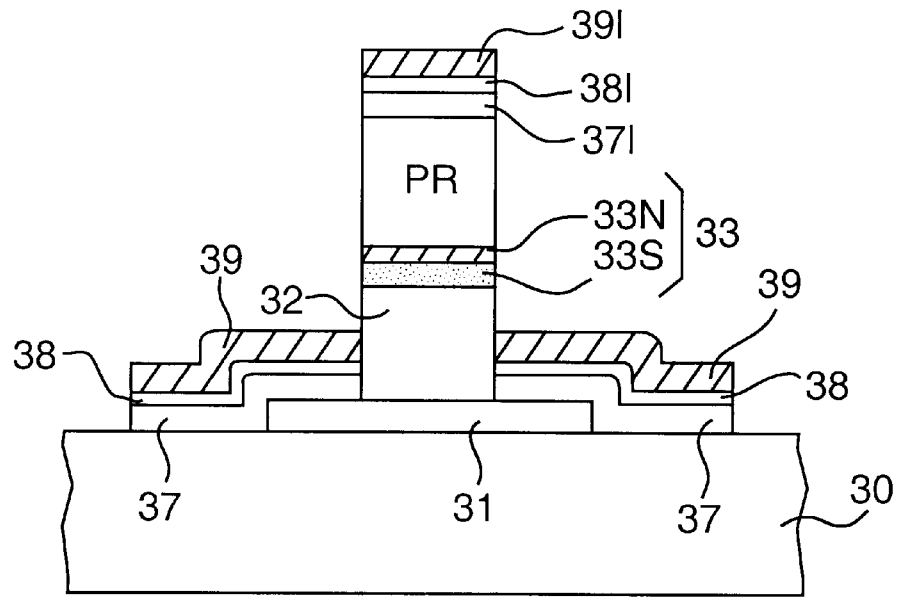

Referring to FIG. 3E, the nickel layer 39ℓ is patterned by photolithography (using a third mask) to form source/drain electrodes 39. Using the source/drain electrodes 39 as a mask, the doped amorphous silicon layer 38ℓ and the amorphous silicon layer 37ℓ are etched to form an ohmic contact layer 38 and an offset layer 37, respectively. As a result, the offset layer 37 positioned above the active layer 31, is formed from the amorphous silicon layer.

Figure 3F:
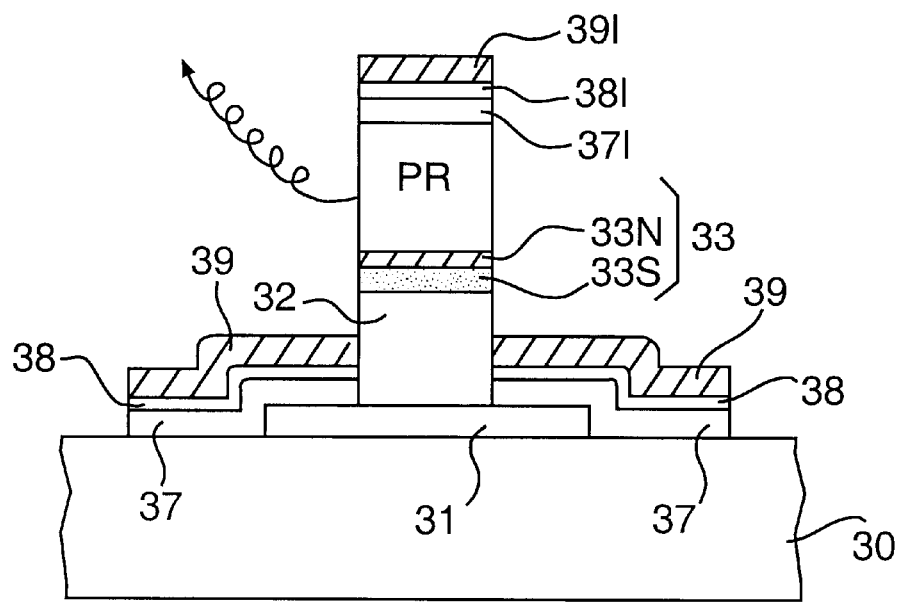

Referring to FIG. 3F, the photoresist pattern PR that is located between the nickel layer 33-2 of the gate electrode 33 and the amorphous silicon layer 37ℓ is removed preferably by the LIFT-OFF method. In the process, the substrate is entirely immersed in a photosensitive material remover solution such as acetone or N-methylpyrrolidone. As a result, the photoresist pattern PR is removed by being dissolved in photosensitive material remover solution. During the removal of the photoresist pattern PR, the amorphous silicon layer 37ℓ, the doped amorphous silicon layer 38ℓ, and the nickel layer 39ℓ formed on the photoresist pattern PR are simultaneously separated from the substrate. Thus, a thin film transistor having the structure shown in FIG. 2 is finally complete.

As described above, the present invention makes it possible to fabricate a thin film transistor having an offset structure using only three masks, since the offset layer is formed above the active layer.

Figure 4:
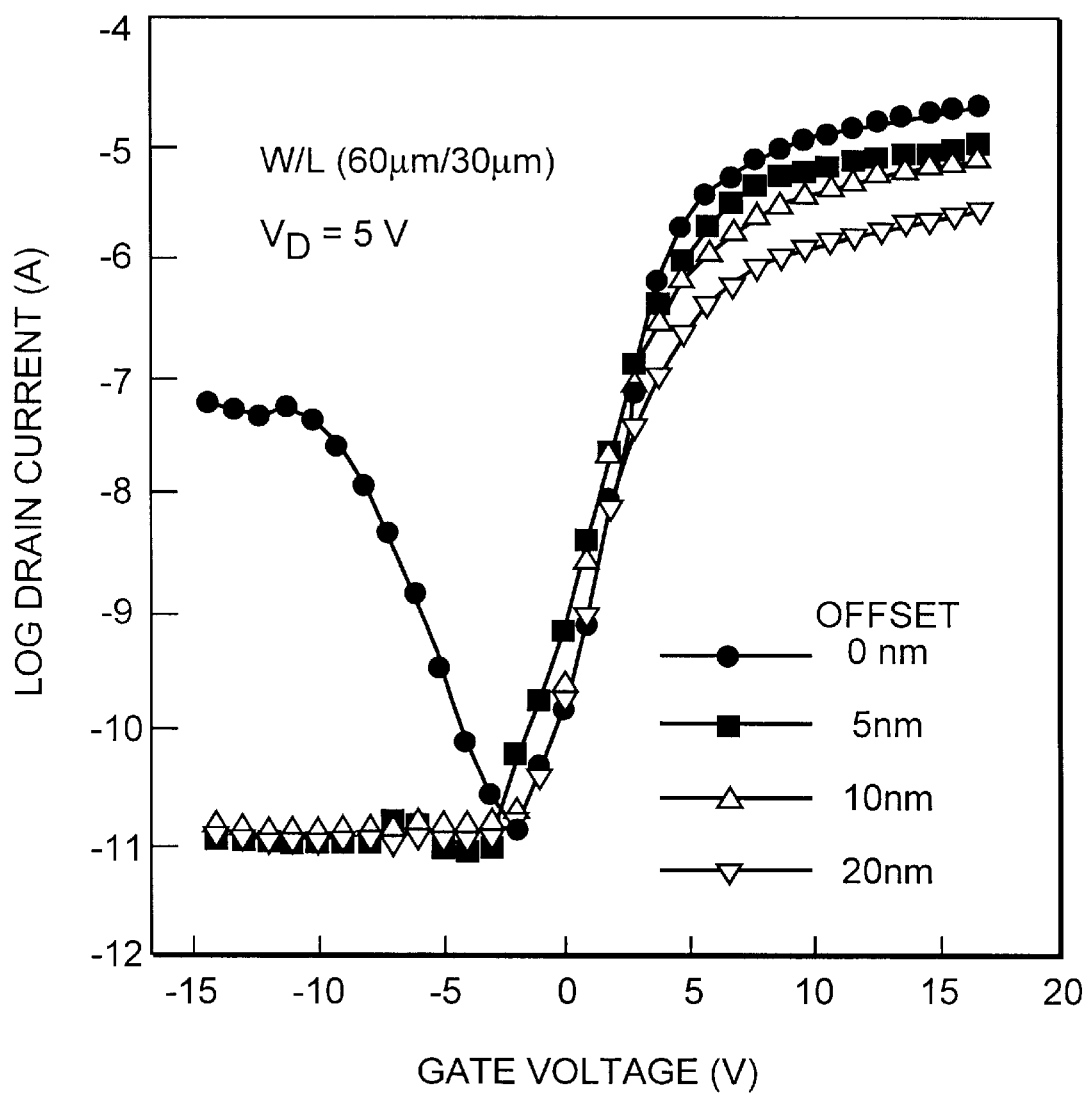
FIG. 4 is a graph showing drain currents for different thicknesses of offset layers in the present invention.
Figure 5:
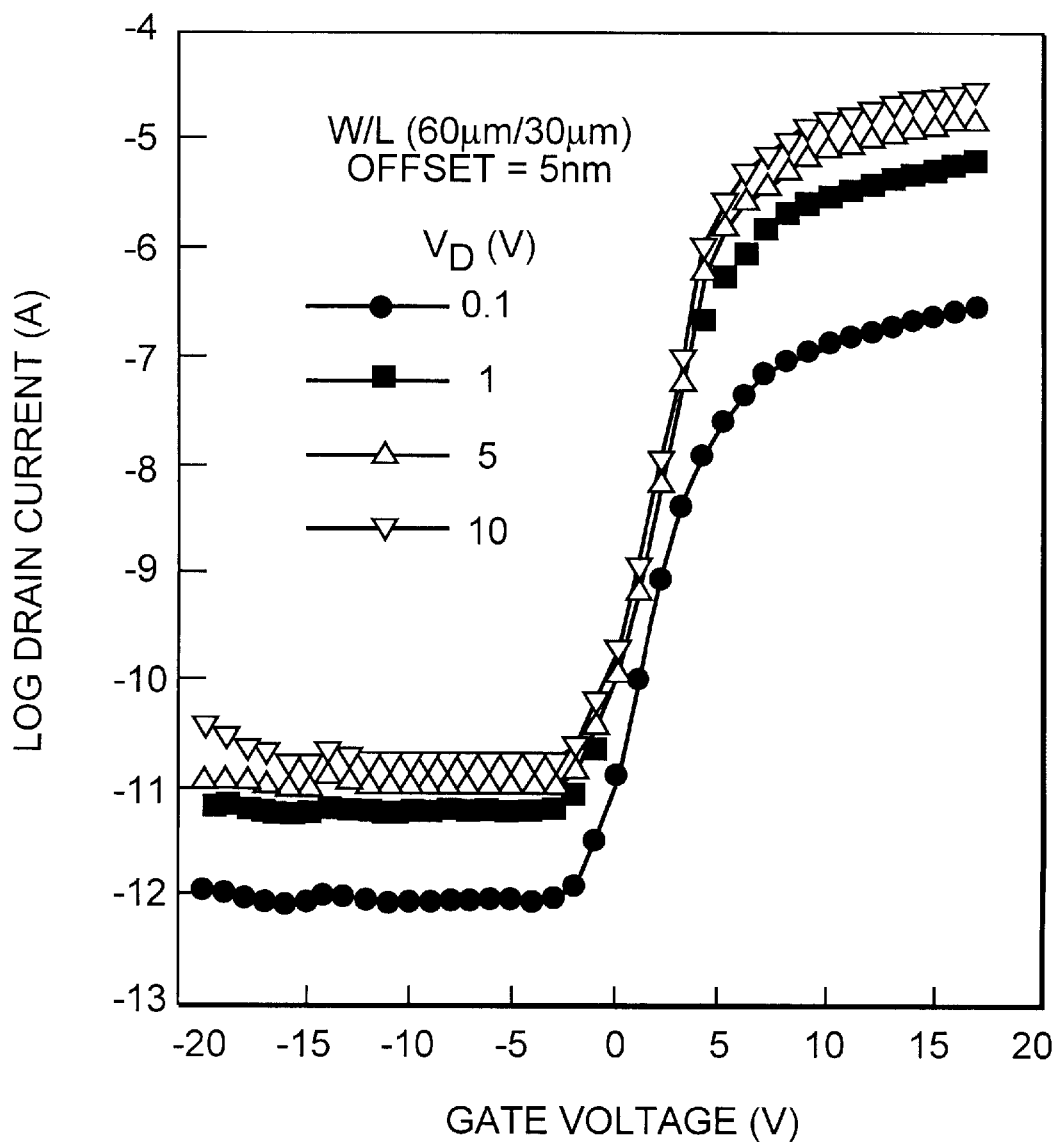
FIG. 5 is a transfer curve showing the relationship between drain current and gate voltage in the present invention.
Figure 6:
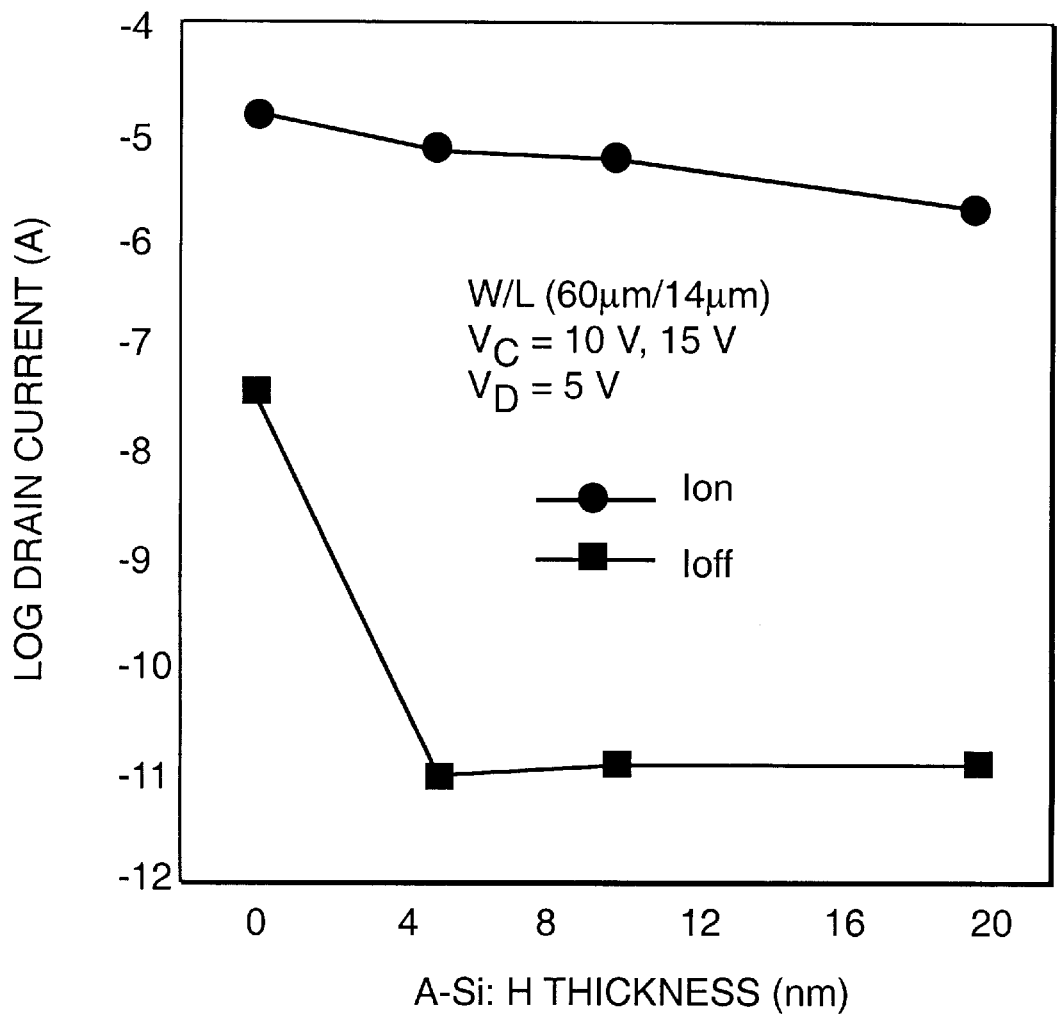
FIG. 6 is a graph showing ON and OFF currents versus the offset layer thickness in the present invention.

FIGS. 4–6 illustrate the physical characteristics of the thin film transistor having the offset layer above the active layer formed by the above-described fabrication of the present invention.

FIG. 4 is a transfer curve plotting the drain current for different thicknesses of the offset layer when the drain voltage is 5 V. The leakage current is very small for a polysilicon thin film transistor having an offset layer. In the case of a thin film transistor without an offset layer, the leakage current at OFF state would increase drastically up to $10^{-8}$ A. In the case of a thin film transistor with an offset layer, the leakage current is extremely small regardless of the thickness of the offset layer. It is apparent that the offset layer serves as a resistance to reduce the leakage current by decreasing the electric field applied to the drain. As seen in the transfer curve of FIG. 4, the leakage current is very low, about $10^{-11}$ A, for a polysilicon thin film transistor having an offset layer approximately 5 nm thick.

FIG. 5 is a transfer curve of drain current versus gate voltage. The leakage current is very small, about $10^{-11}$ A, with a drain voltage of 10 V and a gate voltage of –15 V. For a common thin film transistor having no offset layer, a leakage current is much larger, usually more than about $10^{-9}$ A. As shown in FIG. 4, the leakage current increases in a polysilicon thin film transistor without an offset layer, but not in a thin film transistor with an offset layer. This is due to the offset layer beneath a source and a drain. The offset layer made of amorphous silicon layer plays the role of a resistor to reduce the electric field applied to the drain.

FIG. 6 is a plot of the ON and OFF drain currents versus offset layer thickness of a thin film transistor 60 μm in width and 14 μm length. As shown in FIG. 6, the ON current decreases with the thickness of the offset layer, which means that the offset layer serves as a resistance where the resistivity increases with the thickness of the offset layer. Current reduction by the offset layer results from the offset layer that plays the role of a resistance even in the ON state, and from contact resistance caused by the contact between the amorphous silicon of the offset layer and the doped amorphous silicon, that is, a contact layer. The degree of the decrease of the ON current is small with an offset layer 5 nm thick, but significantly large with an offset layer 20 nm in thick. Accordingly, the offset layer can be 5 nm thick for effective performance of the thin film transistor considering the ON/OFF current ratio.

The present invention makes it possible to reduce the number of masks required for the masking process, that is, the number of photolithographic process needed for fabrication by forming an offset layer above the active layer. The present invention also makes it possible to decrease the drain electric field and leakage current. An offset layer above the active layer can be formed in a smaller area compared to a conventional structure in which the offset layer is formed horizontally relative to a substrate or active layer.

While the invention has been described in detail and with reference to specific embodiments thereof, it will be apparent to one skilled in the art that various changes and modifications can be made therein without departing from the spirit and scope thereof. Thus, it is intended that the present invention cover the modifications and variations of this invention provided they come within the scope of the appended claims and their equivalents.

What is claimed is:

1. A thin film transistor comprising:

a substrate;

an active layer having first and second portions on the substrate;

a gate insulating layer above the first portion of the active layer;

a gate electrode above the gate insulating layer, wherein the gate electrode is a double-layered structure including a metal-silicide layer on the gate insulating layer, and a metal layer on the metal-silicide layer;

an offset layer above the second portion of the active layer;

an ohmic contact layer above the offset layer;

a source electrode above the offset layer at a first side of the gate insulating layer; and a drain electrode above the offset layer at a second side of the gate insulating layer.

2. The thin film transistor of claim 1, wherein the metal layer has a thickness of up to about 200 nm.

3. A thin film transistor comprising:

a substrate;

an active layer having first and second portions on the substrate;

a gate insulating layer above the first portion of the active layer;

a gate electrode above the gate insulating layer;

an offset layer above the second portion of the active layer;

a source electrode above the offset layer at a first side of the gate insulating layer; and a drain electrode above the offset layer at a second side of the gate insulating layer, wherein the gate electrode includes a metal layer above the gate insulating layer, and wherein the gate electrode is a double layered structure including a metal-silicide layer on the gate insulating layer and the metal layer on the metal-silicide layer.

4. The thin film transistor of claim 1, wherein the metal layer is selected from the group consisting of chromium, nickel, aluminum, and platinum.

5. The thin film transistor of claim 1, wherein the gate insulating layer includes a silicon compound.

6. The thin film transistor of claim 5, wherein the gate insulating layer includes silicon nitride.

7. The thin film transistor of claim 1, wherein the offset layer includes amorphous silicon.

8. The thin film transistor of claim 1, wherein the offset layer is perpendicular to the active layer.

9. The thin film transistor of claim 1, further comprising an ohmic contact layer between the source electrode and the offset layer and between the drain electrode and the offset layer.

10. The thin film transistor of claim 1, wherein the offset layer has a thickness of up to about 200 nm.

11. The thin film transistor of claim 1, wherein the gate insulating layer has a thickness of up to about 500 nm.

12. The thin film transistor of claim 1, wherein the active layer has a thickness of up to about 200 nm.

13. The thin film transistor of claim 1, wherein the offset layer is less than 20 nm in thickness for the thin film transistor having a width of about 60 $\mu$m and a length of about 14 $\mu$m.

14. The thin film transistor of claim 1, wherein the gate electrode includes a metal layer formed of a metal selected from a group consisting of chromium, nickel and platinum.

15. The thin film transistor of claim 1, wherein the substrate is formed of glass, and the active layer is formed directly on the substrate.

16. The thin film transistor of claim 1, wherein the offset layer extends at sides of the active layer.

17. A thin film transistor comprising:

a substrate;

an active layer having first, second and third portions on the substrate;

a gate insulating layer above the first portion of the active layer;

a gate electrode above the gate insulating layer, wherein the gate electrode is a double-layered structure including a metal-silicide layer on the gate insulating layer, and a metal layer on the metal-silicide layer;

a first and a second offset layers above the second and the third portions of the active layer, respectively;

a source electrode above the first offset layer at a first side of the gate insulating layer; and a drain electrode above the second offset layer at a second side of the gate insulating layer.

18. The thin film transistor of claim 17, wherein the offset layers include undoped amorphous silicon layers.

19. The thin film transistor of claim 17, further comprising ohmic contact layers between the source electrode and the first offset layer and between the drain electrode and the second offset layer.

20. The thin film transistor of claim 17, wherein the gate electrode includes the metal layer formed of a metal selected from a group consisting of chromium, nickel and platinum.

21. The thin film transistor of claim 17, wherein the substrate is formed of glass, and the active layer is formed directly on the substrate.

22. The thin film transistor of claim 17, wherein the first offset layer extends at a side of the first active layer, and the second offset layer extends at a side of the second active layer.

* * * * *